(12) United States Patent
Mayer et al.

(10) Patent No.: US 7,810,004 B2
(45) Date of Patent: Oct. 5, 2010

(54) INTEGRATED CIRCUIT HAVING A SUBORDINATE TEST INTERFACE

(75) Inventors: Albrecht Mayer, Deisenhofen (DE); Harry Siebert, Puchheim (DE)

(73) Assignee: Infineon Technologies AG, Neubiberg (DE)

( * ) Notice: Subject to any disclaimer, the term of this patent is extended or adjusted under 35 U.S.C. 154(b) by 689 days.

(21) Appl. No.: 11/696,838

(22) Filed: Apr. 5, 2007

(65) Prior Publication Data

US 2008/0040636 A1 Feb. 14, 2008

(51) Int. Cl.
*G01R 31/28* (2006.01)
*G11C 29/00* (2006.01)
*H03M 13/00* (2006.01)

(52) U.S. Cl. .................. 714/734; 714/724; 714/726; 714/763; 714/807

(58) Field of Classification Search .................. 714/712, 714/724, 726, 763, 807, 758, 738, 37, 39, 714/25, 48, 54, 799, 734
See application file for complete search history.

(56) References Cited

U.S. PATENT DOCUMENTS

| 6,088,822 | A | 7/2000 | Warren |
| 6,381,721 | B1 * | 4/2002 | Warren ........................ 714/727 |
| 6,823,282 | B1 * | 11/2004 | Snyder ........................ 702/120 |
| 7,099,963 | B2 * | 8/2006 | Byers et al. ................... 710/48 |
| 2001/0034598 | A1 | 10/2001 | Swoboda |
| 2004/0001432 | A1 | 1/2004 | Wescott |

* cited by examiner

*Primary Examiner*—Phung M Chung
(74) *Attorney, Agent, or Firm*—Dicke, Billig & Czaja, PLLC

(57) ABSTRACT

An integrated circuit having a subordinate test interface and method for transmitting digital data is disclosed. The integrated circuit includes at least one test interface that is adapted to write and read data in and from a data memory, the at least one test interface includes, for transmitting and receiving data of different content categories, one signal line each for every content category. The integrated circuit further includes an interface module for receiving and transmitting data, and that the interface module is, via the signal lines, connected with the test interface for transmitting the data of the different content categories.

22 Claims, 1 Drawing Sheet

INTEGRATED CIRCUIT HAVING A SUBORDINATE TEST INTERFACE

CROSS-REFERENCE TO RELATED APPLICATIONS

This Utility Patent Application claims priority to German Patent Application No. DE 10 2006 016 303.6 filed on Apr. 6, 2006, which is incorporated herein by reference.

BACKGROUND

The invention relates to an integrated circuit with a subordinate test interface, and to a method for transmitting digital data, in particular a method for transmitting test data to a test interface.

Modern microprocessor chips, including SoCs (System on Chip) may include at least one central control and processing unit, a Central Processing Unit or CPU "Core", and a memory area of a size of several MB on one chip. On such a chip, a complex software program and data to be processed, which are executed or processed by the microprocessor, may thus be stored in the memory area. Such chips are, for instance, used in the automotive field in control devices so as to control e.g., engines.

During the development of the programs running on such a chip, and during the tests of the entire chip in the production environment, the software program is tested in combination with the environment of the chip, e.g., the connected sensors and actuators. Particular situations are caused in the chip to test the reaction of the chip.

Several hardware and software systems are known by which chips can be tested. Due to the increasing complexity entailed by the progressing development of chips it is no longer sufficient to observe the behavior of a chip at the pins thereof only. Instead, it has turned out that it is necessary to be able to specifically write test data in the chip memory area, and to read them out alike so as to be able to write test scenarios quickly and directly in the interior of the chip and to directly "observe" the processing of the corresponding data.

For direct write and read accesses to the memory area of a chip, the chip may, for instance, include a test interface which a plurality of own external contacts, i.e. pins, at the chip are assigned to.

Such a test interface is, for instance a JTAG module that will be referred to by way of example in the following in order to explain the invention. An exact specification of this interface is determined in IEEE 1149.

The JTAG standard defines a test interface, a TAP (Test Access Port) with a TAP controller that processes the test data. For the test interface, four signal lines are defined pursuant to the JTAG standard. A first signal line serves to transmit a test clock signal TCK (TCK=TestClocK), and via the second signal line TMS (TMS=TestModeSelect) a test mode signal is transmitted. Via two further signal lines TDI (TDI=TestDataIn) and TDO (TDO=TestDataOut), test data are supplied to the controller or read from it via the signal line TDO, respectively. By an optional fifth signal line, a test reset signal TRST (TRST=TestReSeT) may be transmitted additionally.

The thus specified interface has the disadvantage that at least four pins are required which are not used in the productive operation, i.e. in the actual working mode of the chip. Since these additional pins that are not used during the productive operation of the chip create costs and require space, it has been a permanent object of further developments to keep the number of pins necessary for the debugging of chips as small as possible.

As a solution, it has been suggested to multiplex the JTAG test pins with other pins that are used in the productive operation, so that no additional pins at the chip package have to be used for the implementation of the JTAG test interface. This solution, however, has the disadvantage that the function of the pins used for multiplexing can, during the use of the pins as JTAG test interface, not be tested therewith.

U.S. Pat. No. 6,088,822 thus describes a chip with a JTAG TAP controller which includes the functions specified in the standard, but is also connected with a data adapter on the chip. The data adapter connects the TAP controller with further logic function blocks on the chip. Optionally, in a first operating mode, the TAP controller may thus be operated pursuant to the JTAG standard, or, in a second operating mode, data from outside may, via the TAP controller and the data adapter, be written in the logic function blocks that are attainable via the data adapter, or be read out therefrom. In this variant, it is thus not just the pins of the TAP controller, but also the TAP controller itself that is used for another function not provided in the JTAG standard.

US 2001/0034598 discloses as an alternative solution the time multiplexing of the signals to be transmitted via the different signal lines. The data to be transmitted are successively transmitted via one line, so that, instead of the four—or optionally five—signal lines only one signal line and thus one pin is required for transmitting the information to the JTAG TAP controller. This solution thus reduces the number of pins required for a JTAG test interface.

Modern integrated circuits, in particular modern SoCs, however, often include more than one CPU core. Usually, one respective JTAG test interface is provided for each CPU core, which entails a corresponding number of pins. The JTAG test interfaces thus indeed enable the testing of the CPU cores, but the chip includes an undesired high number of pins for the JTAG test interfaces.

Another disadvantage of a JTAG-compliant test interface is the definition of the TAP controller as a finite state machine, wherein the host computer that is connected externally to the test interface is defined as master, and the chip to be tested is defined as slave. The host computer assumes that the chip or the TAP controller, respectively, of the JTAG test interface is always in the state defined by the TMS signal. A feedback of the chip about its actual state is not provided for. An undesired changing of the chip to another state due to interference will thus not be discovered and can often only be changed by a reboot with a reset of the TAP controller to a defined initial state.

Another disadvantage of the standard results from the specification that the data to be sent to the TAP controller have to be signalized such that a signal edge must have reached the TAP controller after half a clock duration at the latest. This strongly restricts the maximum signal propagation delay on one line and thus the maximally possible length of the data line with a predetermined clock rate.

Meanwhile, however, the JTAG standard has the advantage that there exist already many software programs for host computers by which a chip can be tested via a JTAG TAP controller. Due to the variety of applications developed for the JTAG standard it is therefore useful to maintain the standard to the required extent to be able to further utilize the existing programs.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
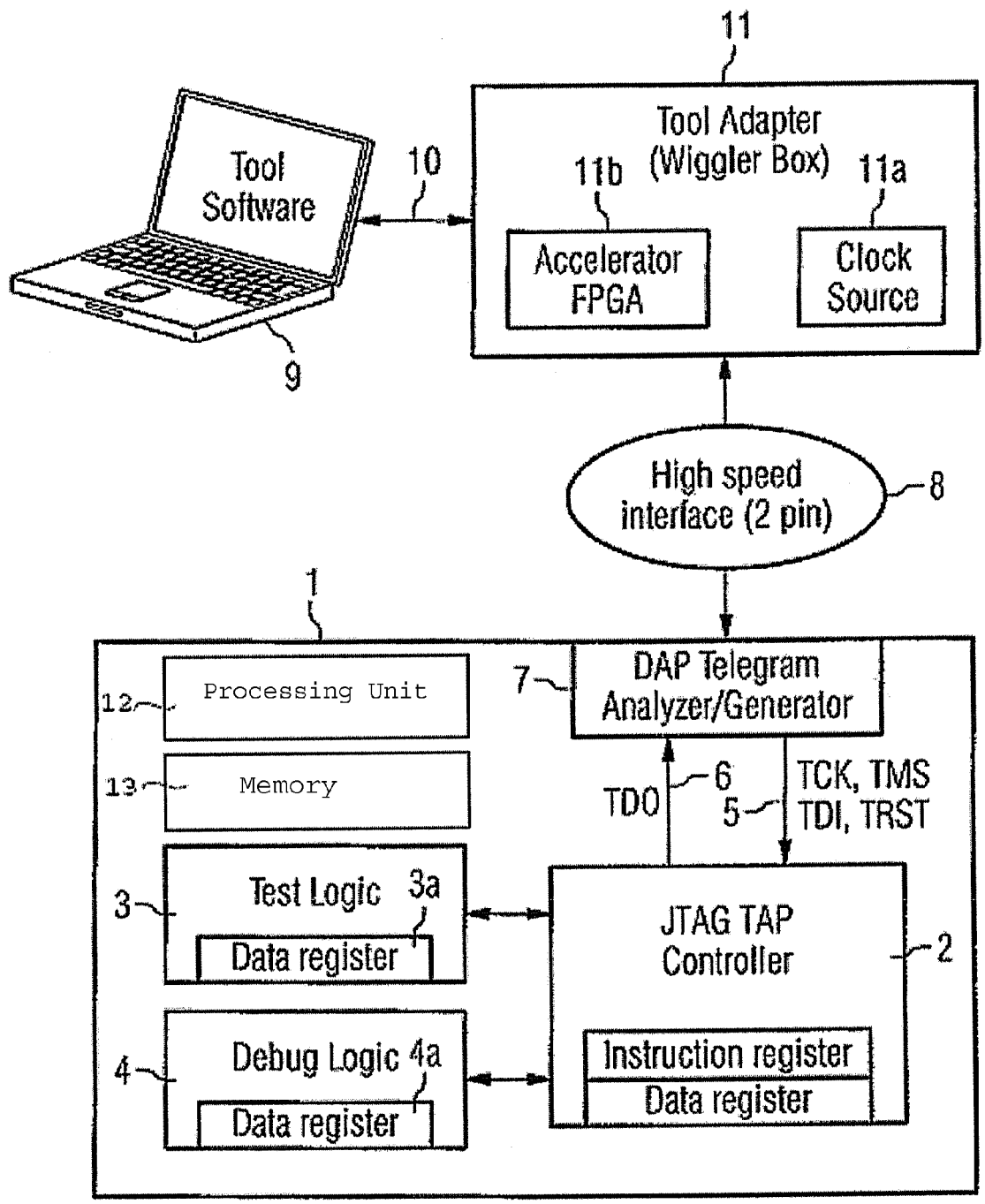
FIG. 1 illustrates a schematic representation of a system with an integrated circuit in accordance with an exemplary embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the FIGURE(S) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide a method for transmitting digital data, in particular test data, and a novel integrated circuit with at least one test interface. The number of pins or pads required for data transmission are reduced, and/or one or several of the afore-mentioned disadvantages can be avoided at least partially.

Further, it is to be ensured simultaneously that the existing applications for host computers can be further used.

In accordance with one embodiment there is provided an integrated circuit including a data memory and at least one processing unit. The processing unit is adapted to access the data memory for processing data stored therein, and at least one test interface that is adapted to write and read data in and from the data memory. The at least one test interface includes, for transmitting and receiving data of different content categories, one signal line each for every content category. The integrated circuit includes an interface module with a serial interface for receiving and transmitting data, wherein the interface module is, via the signal lines, connected with the test interface for transmitting the data of the different content categories.

The interface module receives data via the serial interface which include the information to be signalized to the test interface. The information to be signalized to the test interface is transmitted to the test interface in correspondence with the different content categories via the respectively pertinent signal line.

The interface module thus enables the receipt of data telegrams via the serial interface. The data telegrams supply the information that is signalized to a TAP controller via the four or optionally five signal lines TCK, TDI, TDO, and TMS, and optionally TRST. The interface module is connected with the TAP controller via these signal lines that correspond to the JTAG standard and signalizes the information contained in data telegrams to the TAP controller. Thus, the TAP controller receives the information corresponding to the JTAG standard.

In reverse direction, the interface module receives data which the TAP controller is to signalize to the outside via the signal line TDO and correspondingly generates one or several data telegrams that are subsequently transmitted to the outside via the serial interface and beyond the chip boundary.

Outside the integrated circuit, i.e. outside the chip, the information to be supplied to the TAP controller is thus not transmitted pursuant to the protocol defined in the JTAG standard, but pursuant to a protocol deviating therefrom.

Inside the integrated circuit, the information is, however, signalized to the TAP controller via the four or five lines in correspondence with the JTAG standard. The interface module thus has the function of a format converter that converts the information from the data telegrams to be supplied to the TAP controller to the format specified in the JTAG standard, so that the information can be signalized via the separate signal lines TDI, TMS, TCK, and TRST, and formats, in the inverse direction, the information to be signalized to the outside via the signal line TDO to one or several data telegrams.

Thus, an intermediate layer is introduced in the communication of the TAP controller with a host computer that exchanges data with the TAP controller; in this intermediate layer, all the information is transmitted in the form of data packets between the TAP controller and the host computer and via the serial interface of the interface module.

The serial interface and the transmission protocol may be any serial interface and any transmission protocol pursuant to prior art, so that the data to be signalized to the test interface can be transmitted outside the chip more quickly than pursuant to the JTAG standard.

In accordance with a second embodiment there is provided a method for transmitting digital data of different content categories from a first station to a second station, wherein the second station, for receiving data of different content categories, includes one signal line each for every content category, and wherein the data are transmitted, via a serial interface, to an intermediate station upstream of the second station, and wherein the intermediate station transmits the data to the second station via the signal line corresponding to the content category.

The first station is, for instance, a host computer that transmits data via the four or five signal lines of a JTAG test interface, i.e. data of one content category, to a JTAG interface—the second station. Before the data are transmitted via the signal lines to the JTAG test interface, they are, via a serial interface, transmitted to an intermediate station, namely the interface module upstream of the JTAG test interface in the direction of the data flow. The interface module subsequently transmits the data to the JTAG test interface or to the TAP controller of the JTAG test interface, respectively, via the four or five signal lines of the TAP controller.

Reference number 1 in FIG. 1 illustrates an integrated circuit that is to be tested and in which only the function blocks that are relevant for the invention are plotted schematically as blocks and the data connections are plotted schematically as arrows.

The integrated circuit 1 includes at least one processing unit 12, a CPU core, with a pertinent memory 13. In the memory, the data to be processed by the processing unit and the control program, i.e. the software, are stored. During operation, the processing unit accesses the memory in the known manner and processes the stored data in correspondence with the instruction sequence of the software. Such an integrated circuit 1 may, for instance be a microprocessor or microcontroller known from the automotive field, which is a complete processing system and may be referred to as a SoC="System on Chip".

The integrated circuit 1 further includes at least one test interface 2. In the illustrated embodiment, this is a per se known TAP controller (TAP=Test Access Port) pursuant to the JTAG standard. The test interface 2 may be connected in a known manner with a test logic 3 and a debut logic 4, into which the test interface 2 can write data in the known manner and pursuant to the JTAG standard, and can read them out alike. The test logic 3 and the debug logic 4 write the transmitted data in the corresponding data registers 3a of the test logic 3 or in the data registers 4a of the debug logic 4, respectively. The data stored in the data registers 3a, 4a are processed by the processing unit. Subsequently, the result data are stored in corresponding data registers 3a, 4a from which the result data are read out.

The test interface 2, in the instant embodiment the TAP controller, includes the four or optionally five signal lines 5, 6 specified in the JTAG standard, via which the TAP controller receives the data of the different content categories, and via which the result data are transmitted. Via the signal line TDI, the data of a first content category, namely the test data TDI, are, for instance, communicated to the TAP controller, and via the signal line TMS the data of a second content category, namely the signal TestModeSet. In analogy, the result data to be communicated by the TAP controller 2 form, for instance, a further content category, which are signalized via the signal line TDO. The TAP controller thus includes one signal line each for the communication of data of one content category. In the schematic representation, the four signal lines 5 TCK (TestClock), TMS (TestModeSet), TDI (TestDataIn) and the optional signal line TRST (TestReSeT) defined in the JTAG standard are symbolized corresponding to the transmission direction of the information by an arrow 5 showing into the TAP controller. Correspondingly, the signal line via which the TAP controller 2 communicates the result data is symbolized by an arrow 6 showing away from the TAP controller 2.

In contrast to known integrated circuits with test interfaces, the five signal lines of the TAP controller are, in the illustrated integrated circuit, not guided to pins or pads of the chip, but to an interface module 7, so that the TAP controller 2 is connected therewith for transmitting the data of the different content categories. The interface module 7 may thus also be designated as "Device Access Port" (DAP) since it enables the access to the device, i.e., the chip. The TAP controller 2 thus receives the data to be processed by it no longer directly via pins or pads of the integrated circuit 1, but via the interface module 7.

The signal lines 5, 6 of the test interface 2 are thus no longer contactable via the pins or pads of the integrated circuit 1, but are quasi hidden.

The interface module 7 includes a serial interface 8 whose signal lines are guided to pins or pads of the integrated circuit 1, and via which the interface module 7 is adapted to communicate beyond the boundaries of the integrated circuit 1.

To communicate test data from outside of the integrated circuit 1 to the test interface 2, they are transmitted to the serial interface 8 of the interface module 7 and subsequently from the interface module 7 via the signal lines 5 to the test interface 2.

The serial interface 8 may be designed in line with the known prior art, and may require few pins or pads of the integrated circuit 1, so that only few additional pins or pads are necessary for communication with the test interface. Especially interfaces which enable a high data transmission rate with simultaneously high transmission safety, for instance, pursuant to the LVDS (Low Voltage Differential Signaling) principle are suitable, or interfaces operating by using an optical fiber. A two wire line may also be used, wherein a clock signal is transmitted on one line wire and the data signal on the other one, so that no longer 4 or 5 pins are necessary for transmitting the data for the test interface 2, but only 2 pins.

Alternatively to the illustrated transmission with a two wire line, any signalizing method may be used that is suited for the quick and safe transmission of data to the serial interface 8 of the interface module 7. A per se known method may, for instance, also be used in which clock and data are transmitted via one line only, so that only one pin or pad is required for the serial interface.

In practice, it has turned out during the operation of test interfaces pursuant to the JTAG standard that the entire communication with such an interface can be divided into respective self-contained data telegrams, wherein only a limited number of such data telegrams has to be defined. For the transmission of the information to be communicated to the test interface 2, the information is transmitted in the form of data telegrams via the serial interface 8 of the interface module 7. Each data telegram may contain at least the information required for a change of state of the TAP controller, wherein the information may cause the TAP controller to run through a cycle of several states and finally assumes the initial state again.

The data telegrams contain, in addition to the mere useful information that is to be communicated to the test interface 2, further data fields in which further information is contained.

The interface module 7 includes logic elements that are suited for the processing of the further information.

It includes, for instance, suitable logic elements for the interpretation of an instruction signalized in a data field of the data telegram so as to subsequently execute it. Such an instruction may, on the one hand, relate to the processing of the data to be transmitted to the TAP controller, or to an instruction, for instance, an instruction to be signalized via the TMS signal line, or to the reset to be signalized via the TRST signal line. On the other hand, such an instruction may relate to the interface module itself.

In a further field of the data telegram, a checksum may be transmitted, so that a possibility for checking the faultless receipt of a data telegram is given. Such a checksum may, for instance, be calculated in accordance with a per se known CRC (Cyclic Redundancy Check) method.

The interface module 7 includes, for checking the checksum transmitted with a data telegram, suitable means for calculating the checksum and for comparing the calculated value with the transmitted checksum.

For transmitting information or data from the TAP controller via the interface module 7 to the outside it generates corresponding data telegrams from the data supplied by the TAP controller, which are signalized to the outside via the serial interface 8.

The generation of the data to be transmitted to a test interface 2 may be performed in a per se known manner by a host computer 9 on which a per se known software program for the controlling of a test interface 2 is executed and which is connected with the interface module 7. Such a host computer may, for instance, be a PC. Since PCs usually do not include a suitable interface for the direct data transmission to an interface module 7, the data to be transmitted are, in a known manner, transmitted to an adapter 11 via a standardized connection 10. The adapter 11 includes per se known means for communicating, on the one hand, with the host PC and, on the other hand, with the interface module 7.

The adapter of the embodiment includes, for instance, a clock generator 11a for generating a clock signal that is signalized to the interface module 7 via the serial interface 8 and that is used for sensing the data. Furthermore, the adapter includes a FPGA 11b (Field Programmable Gate Array) for generating the data telegrams from the data supplied by the host PC 9. The adapter 11 may be connected with several host PCs 9 which each communicate with a TAP controller.

The software programs for controlling the test interface 2 running on the host PC 9 may be further used without modification since the communication interface between the adapter 11 and the host computer 9 is not modified.

In integrated circuits 1 that include a plurality of TAP controllers 2, all TAP controllers 2 may be connected with their respective signal lines with an interface module 7.

For differentiating the TAP controllers 2 from one another and for specific communication, a definite identification may be assigned to each TAP controller 2. This identification has to be known to the interface module and is communicated to it, so that the interface module 7 is adapted to specifically communicate with a TAP controller 2. In so doing, it is ensured by using per se known methods that only the communication between the interface module 7 and one TAP controller 2 can take place at a time, so that the plurality of TAP controllers 2 do not mutually interfere when communicating with the interface module 7.

Simultaneously, the protocol for communication of the interface module 7 with the host computer 9 is extended via the adapter 11, so that the interface module 7 is signalized for which of the plurality of TAP controllers 2 a data telegram is destined. The host computer 9 may, for instance, communicate in a data telegram that subsequent data telegrams are destined for a particular TAP controller 2. Alternatively, each data telegram might contain information for which of the TAP controllers 2 the data telegram is destined.

With the introduction of the interface module 7 in the communication with a test interface 2, a novel method for transmitting digital information between a first station, which is in the instant case the host PC 9, and a second station, which is in the instant case a test interface 2, is provided. The second station includes one signal line 5, 6 each for every content category for receiving and transmitting information of different content categories. In the described embodiment, these are the signal lines 5 TCK, TMS, TDI, TRST, and 6 TDO of the TAP controller. With the transmission of the data telegrams via the serial interface 8 to the interface module 7, the data are transmitted to an intermediate station upstream of the second station, from which the content of a data telegram is guided to the signal line 5, 6 that corresponds to the corresponding content category.

In reverse direction the transmission method is performed correspondingly. The information to be transmitted from the second station, i.e. a test interface 2, to the first station, i.e. the host PC, is, via the signal lines of the different content categories 5, 6, transmitted to the intermediate station, i.e. the interface module 7. The intermediate station transmits the data received from the second station via the serial interface 8 to the first station, i.e. the host PC 9.

The data exchange between the first and the second station thus takes place only via the intermediate station, wherein the data are transmitted serially from the first station to the intermediate station, and via the signal lines 5, 6 of the different content categories between the intermediate station and the second station.

In this method, a checksum may be transmitted with every data telegram for checking the correct data transmission between the first station and the intermediate station, wherein the checksum is checked by the respective receiver of a data telegram. In the case of a faulty transmission, the respective receiver may then signalize the transmission error to the sender and trigger a repetition of the transmission or some other error processing.

In the described embodiment, the first station is the host PC 9 which is, via the adapter 11, connected with the serial interface 8 of the interface module 7.

The transmission of the data from and to the serial interface 8 of the interface module 7 is performed in accordance with the half duplex method, so that the restriction of the line length caused by the JTAG standard is omitted.

Furthermore, the interface module 7 may itself be designed as a finite state machine which is adapted to assume a predetermined number of defined states.

In a first state, the OFF state, the interface module 7 is inactive. This state is assumed if no data exchange is to take place via the serial interface 8.

The interface module 7 assumes a second defined state if a clock signal is detected via the serial interface 8. This state is, for instance, assumed automatically if a clock signal is detected after the activating of the interface module 7. In this state, the interface module 7 is ready for receiving data telegrams.

A third state is assumed if the interface module is active, but no clock signal can be detected. This state is, for instance, assumed if the active interface module 7 is no longer able to detect a clock signal at the serial interface 8. The state is left automatically and the second state is assumed as soon as a new clock signal has been detected at the serial interface 8.

In case the interface module 7 repeatedly detects a transmission error or loses the synchronization with the host computer, it is provided that the interface module at any rate assumes exactly one of the predetermined states.

If, for instance, the interface module loses the clock signal, the third state is assumed. This state is left and the second state is assumed as soon as a clock signal has been detected.

This way it is ensured that the interface module 7 assumes a predetermined state after the occurrence of an interference at the latest after the expiration of a particular number of clocks, so that the host PC 9 is adapted to again communicate as provided with the interface module 7 with a clock signal applied.

Finally, in case the integrated circuit 1 includes a plurality of TAP controllers 2, the method may be extended correspondingly, so that data telegrams can definitely be assigned to a TAP controller. To this end, a definite identification that is known to the interface module 7 may, for instance, be assigned to a TAP controller 2. As already mentioned above, the protocol for communication between the host PC 9 and the interface module 7 may be adapted such that data telegrams can be transmitted to a particular TAP controller 2. To this end, it may, for instance, be provided that the interface module 7 is communicated in a data telegram that the subsequent data telegrams are provided for a particular TAP controller 2. Alternatively, the information for which of the TAP controllers 2 the data telegram is provided may be added to each data telegram. This way, communication with a plurality of TAP controllers 2 can be performed via one interface module 7.

By the introduction of the interface module and the specific data transmission method performed by using same, the number of pins or pads required for a data exchange with one or a plurality of TAP controller 2 may, for instance, be reduced. Additionally, the transmission rate and/or reliability may, for instance, be increased by the serial interface 8 of the interface module 7.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a data memory;
   at least one processing unit, configured to access the data memory;
   at least one test interface configured to write and read data in and from the data memory, the at least one test interface configured for transmitting and receiving data of different content categories, comprises one signal line each for every content category; and
   an interface module for receiving and transmitting data, and the interface module is, via the signal lines, connected with the test interface for transmitting the data of the different content categories to the test interface.

2. The integrated circuit of claim 1, wherein the interface module comprises a data signal line and a clock signal line.

3. The integrated circuit of claim 1, wherein the integrated circuit comprises more than one test interface, and wherein the interface module is connected with more than one test interface.

4. The integrated circuit of claim 1, wherein the interface module is equipped for checking a checksum.

5. The integrated circuit of claim 1, wherein the interface module comprises a device access port.

6. The integrated circuit of claim 5, wherein the interface module comprises at least four signal lines to the processing unit.

7. An integrated circuit comprising:
   a data memory;
   at least one processing unit, configured to access the data memory;
   at least one test interface configured to write and read data in and from the data memory, the at least one test interface configured for transmitting and receiving data of different content categories, comprises one signal line each for every content category; and
   means for providing an interface module for receiving and transmitting data, and the interface module means is, via the signal lines, connected with the test interface for transmitting the data of the different content categories to the test interface.

8. The integrated circuit of claim 7, wherein the interface module comprises a data signal line and a clock signal line.

9. The integrated circuit of claim 7, wherein the integrated circuit comprises more than one test interface, and wherein the interface module is connected with more than one test interface.

10. The integrated circuit of claim 7, wherein the interface module is equipped for checking a checksum.

11. The integrated circuit of claim 7, wherein the interface module and at least one test interface are arranged on a substrate.

12. The integrated circuit of claim 7, wherein the test interface corresponds to standard IEEE 1149.

13. An integrated circuit comprising:
   a data memory and at least one processing unit, wherein the processing unit is configured to access the data memory for processing data stored therein;
   at least one test interface is adapted to write and read data in and from the data memory, the at least one test interface, for transmitting and receiving data of different content categories, comprises one signal line each for every content category, wherein the integrated circuit comprises an interface module with a serial interface for receiving and transmitting data; and
   the interface module is, via the signal lines, connected with the test interface for transmitting the data of the different content categories.

14. A method for transmitting digital data of different content categories from a first station to a second station, wherein the second station, for receiving data of different content categories, comprises one signal line each for every content category, comprising:
   transmitting the data via a serial interface to an intermediate station upstream of the second station in the form of data telegrams, wherein the intermediate station checks, for each data telegram, a check value transmitted with the data telegram to detect transmission errors, and triggers error processing on detection of a transmission error; and
   transmitting the data via the intermediate station to the second station via the signal line corresponding to the content category.

15. The method of claim 14, comprising the second station further transmitting data of different content categories via the respectively corresponding signal line to the intermediate station; and
   wherein the intermediate station signalizes information corresponding to the data via the serial interface to the first station.

16. The method of claim 14, comprising adapting the intermediate station to assume a predetermined number of different states.

17. The method of claim 14, wherein the intermediate station assumes a predefined initial state after switching on the power supply.

18. The method of claim 14, wherein the transmission of the data telegrams from the first station to the intermediate station takes place in the half duplex method.

19. The method of claim 14, comprising connecting a plurality of second stations with the intermediate station and identifying each of the second stations by the intermediate station by a definite identification, and wherein the intermediate station transmits the information of a data telegram to the second station corresponding to the identification.

20. The method of claim 14, wherein the second station is a test interface of an integrated circuit.

21. The method of claim 20, comprising defining the test interface pursuant to standard IEEE 1149.

22. The method of claim 21, wherein a data telegram contains the information for at least one state transition of the test interface.

* * * * *

UNITED STATES PATENT AND TRADEMARK OFFICE
CERTIFICATE OF CORRECTION

PATENT NO.        : 7,810,004 B2
APPLICATION NO.   : 11/696838
DATED             : October 5, 2010
INVENTOR(S)       : Mayer et al.

Page 1 of 1

It is certified that error appears in the above-identified patent and that said Letters Patent is hereby corrected as shown below:

Front Page, insert Item [30] --Foreign Application Priority Data
Apr. 6, 2006    (DE) .............................. 10 2006 016 303--.

Signed and Sealed this
First Day of March, 2011

David J. Kappos
*Director of the United States Patent and Trademark Office*